United States Patent [19]

Nisizawa et al.

[11] Patent Number: 4,479,845
[45] Date of Patent: Oct. 30, 1984

[54] VAPOR GROWTH WITH MONITORING

[75] Inventors: Jun-ichi Nisizawa; Masaaki Fukase, both of Sendai, Japan

[73] Assignee: Semiconductor Research Foundation, Japan

[21] Appl. No.: 388,198

[22] Filed: Jun. 14, 1982

Related U.S. Application Data

[63] Continuation of Ser. No. 161,980, Jun. 20, 1980, abandoned.

[30] Foreign Application Priority Data

| Nov. 22, 1979 [JP] | Japan | 54-151206 |
| Nov. 22, 1979 [JP] | Japan | 54-151207 |
| Nov. 22, 1979 [JP] | Japan | 54-151208 |
| Nov. 22, 1979 [JP] | Japan | 54-151209 |

[51] Int. Cl.³ .......................................... C30B 25/16
[52] U.S. Cl. ..................................... 156/601; 156/606
[58] Field of Search ........ 156/601, 605, 606, 610-614; 148/174, 175; 427/85, 86, 248; 118/720, 724, 118/725; 422/245; 364/500

[56] References Cited

U.S. PATENT DOCUMENTS

| 3,316,121 | 4/1967 | Lombos et al. | 156/601 |
| 3,449,071 | 6/1969 | Campbell et al. | 156/601 |
| 3,892,490 | 7/1975 | Uetsuki et al. | 156/601 |
| 4,153,486 | 5/1979 | Srinivasan | 156/613 |

*Primary Examiner*—Hiram H. Bernstein
*Attorney, Agent, or Firm*—McGlew and Tuttle

[57] ABSTRACT

In vapor growth of a doped semiconductor layer on a substrate, a plurality of sampling points are selected in the layer to be grown and in the substrate and each treated as a diffusion source. Computation is carried out to provide the actual doping program for realizing a desired doping profile and to provide the resultant doping profile from the actual doping characteristics. Monitoring means monitors the vapor growth and feeds back information to computing means. The computing means rearrange the doping program and supply command to means for controlling the vapor growth.

It is found it is effective to invert the conductivity type of impurity at least two times particularly in the initial stage of the vapor growth for providing a sharp profile of net impurity distribution.

6 Claims, 15 Drawing Figures

VAPOR GROWTH WITH MONITORING

This is a continuation of application Ser. No. 161,980 filed June 20, 1980, and now abandoned.

BACKGROUND OF THE INVENTION

1. Field of the Invention

This invention relates to vapor growth of semiconductor and more particularly to monitored vapor growth of doped semiconductor.

2. Description of the Prior Art

Vapor growth techniques play a very important role in processing of semiconductor devices. Epitaxial vapor growth of a high resistivity layer on a low resistivity substrate enabled the recent high speed integrated circuits. With the progress of the designing of semiconductor devices, there is an intense demand for precisely controlling the doping profile. Most of the epitaxial growth, however, is controlled only empirically through the mixing ratio of dopant and the growth temperature. These parameters are usually kept constant during growth. Impurities in a semiconductor body are subjected to solid diffusion or redistribution in any high temperature process. Accordingly, when an epitaxial layer of a high resistivity (low net impurity concentration) is grown on a substrate of a low resistivity (high net impurity concentration), the epitaxial layer is subjected to impurity diffusion from the substrate. Similar impurity diffusion occurs between any adjacent semiconductor regions.

Recently, monitoring of epitaxial growth, especially in-situ monitoring, is attracting attention. On-line monitoring was proposed in Japanese Patent Publication No. 44787/1978, in which the doping gas was sampled from the path of the doping gas before mixing with the carrier gas for controlling the impurity concentration in the doping gas. The doping gas is analized through flame spectroscopy. Provision of a sampling capillary in a reaction chamber was also proposed for the in-situ monitoring and controlling of epitaxial growth, in Japanese Utility Model Laid-Open Publication No. 62070/1977.

Epitaxial growth has an advantage that the doping level can be widely varied in time during a single growth process without intervening any other process. For example, when an epitaxial layer of a low impurity concentration is to be grown on a substrate including a semiconductor region of high impurity concentration, there may be successively formed on the substrate initially a thin layer of a relatively high doping level for compensating the impurities redistributed from the region of high impurity concentration and then the main epitaxial layer of the predetermined low doping level. Such a counterdoping technique is widely known, but can modify the doping profile only in limited manner and to limited accuracy. It is apparent that epitaxial growth can potentially provide various doping profiles as desired, but to the inventors' knowledge there is no proposal for the control of doping profile in very wide variations, more particularly no proposal for the computer-aided design and in-situ control of the doping profile in a semiconductor wafer.

SUMMARY OF THE INVENTION

An object of the present invention is to provide vapor growth method and apparatus for achieving a desired doping profile.

Another object of the present invention is to provide vapor growth method and apparatus for in-situ monitoring vapor in a growth chamber and controlling the doping level according to a predetermined doping program.

Further object of the present invention is to provide vapor growth method and apparatus for growing an epitaxial layer of desired doping profile through inverting the conductivity type of the doping impurity at least two times.

Vapor growth of semiconductor such as silicon is carried out at relatively high temperatures at which solid phase diffusion of impurity in the semiconductor is not negligible. Therefore, the doping profile in the grown layer and also in the substrate is varied by the redistribution (solid diffusion and autodoping) of the impurity. Compensation doping is effective to suppress the effect of redistributed impurity to some extent, but the compensating impurities themselves diffuse into the epitaxial layer and may cause problem by themselves. Thus, available doping profile is very limited according to the conventional simple method.

According to an aspect of the present invention, every pertinent portion in the substrate and in the epitaxial layer is considered as a diffusion source and computation is carried out to provide the doping program for realizing a desired doping profile. Then, vapor growth is monitored in situ and controlled to produce the desired doping profile. It is found that multiple counterdoping is very effective to realize various doping profiles. In a preferred embodiment, the conductivity type of the doping impurity is inverted at least two times.

Further objects features and advantages of the present invention well become apparent in the following description on preferred embodiments referring to the attached drawings.

DESCRIPTION OF PREFERRED EMBODIMENTS

First, general doping characteristics in an epitaxial layer will be described to help understanding of the present invention.

Figure 1:
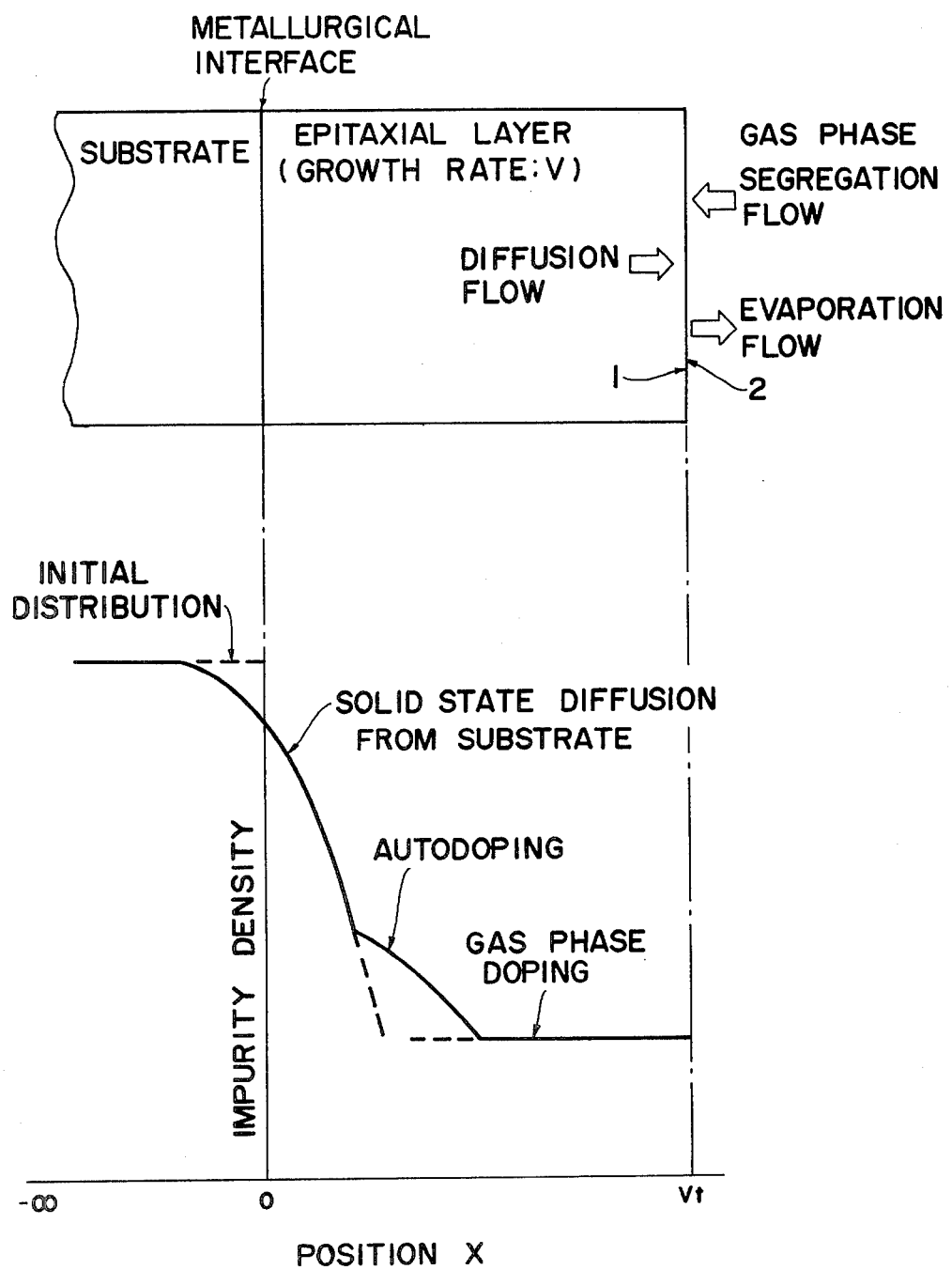
FIG. 1 is a graph for explaining the impurity distribution in an epitaxially grown crystal.

FIG. 1 shows the impurity distribution in the depth direction of the epitaxially grown crystal. Ordinate and abscissa represent impurity concentration and position (depth), respectively. Origin of the position coordinate x=0 denotes the interface between substrate and the epitaxial layer. Epitaxial layer grows toward positive direction. Arrows in the upper figure express flow of the impurity existing near the growing surface.

The lower figure of FIG. 1 shows that impurity distribution in the epitaxial growth layer is composed of three components, that is, solid-state diffusion from substrate, doping from gas phase and autodoping. If impurity is doped from the gas phase during epitaxial growth directly according to the desired impurity profile, solid state diffusion and autodoping have a bad influence upon and serve to deform the desired impurity profile. Thus, it is difficult to realize the desired impurity profile by the simple gas phase doping. FIG. 1 shows a case where epitaxial layer of a high resistivity is grown on a substrate or a low resistivity. Let use assume that the impurity concentration is desired to be abruptly changed at the interface between the epitaxial layer and the substrate. The impurity profile actually realizable, however, is not a step function due to the effect of said state diffusion and autodoping.

There are two conduction types of impurity, i.e. donor and accepter. When semiconductor crystal contains donor and accepter at the same location, these two types of impurity compensate each other. The net impurity concentration is the difference between the donor concentration and the acceptor concentration. Therefore, it is effective for the realization of the desired impurity profile to dope the impurity which has the inverse or opposite type to the impurity contained in the substrate. Multiple compensation or counter doping is found to be more effective to provide a sharp profile. Examples of input doping profile for providing desired doping profiles will be described in more detail later.

Autodoping can be avoided in various manners. Autodoping may arise from the backetching of rear surface of the substrate. Impurities of the substrate may be released from the substrate and fly out in the gas phase and are incorporated again in the epitaxial layer. One of methods for suppressing the effect of autodoping is to reduce the flying out of impurities from substrate. For this purpose $SiH_4$ is more suitable than $SiCl_4$ for the silicon source. Pre-growth before the main or regular epitaxial growth is also effective because the autodoping is suppressed within the pre-epitaxial layer. As the n type silicon substrate, Sb-doped substrate is more suitable to suppress the effect of autodoping because vapor pressure of Sb is lower than other impurities. But solid solubility of Sb in Si is lower. Therefore, we cannot but use As doped substrate when low resistivity substrate is needed. In this case, epitaxial growth under low pressure is effective because impurity atoms released into gas phase is hard to be incorporated again into the epitaxial layer.

Solid state diffusion from substrate can be described by the diffusion equation with moving boundary. Impurity contained in the substrate plays a role as the distributed diffusion source which starts to diffuse into epitaxial layer at the same time as the beginning of growth. The portion of the impurity reached to the growing surface evaporates into gas phase. Probability that impurity atoms released into gas phase by evaporation are incorporated into the epitaxial layer again, is small. Therefore, the boundary condition is that diffusion flow at the inner surface of FIG. 1 is equal to evaporation flow at the outer surface 2. These phenomena are described by the following equations. Basic equation:

$$\frac{\partial u(x,t)}{\partial t} = D(t) \frac{\partial^2 u(x,t)}{\partial x^2} \quad (-\infty < x < Vt) \tag{1}$$

Initial condition:

$$u(x,t) = \psi(x) \text{ at } t=0 \tag{2}$$

Boundary condition:

$$D(t) \frac{\partial u(x,t)}{\partial x} = hu(x,t) \text{ at } x = vt \tag{3}$$

Here, u(x,t): content of the impurity, $\psi(x)$: distributed diffusion source contained in a substrate, D(t): diffusivity, V: growth rate, h: evaporation coefficient. In case of time invariant diffusivity: $D(t)=D_0$, following solution can be derived.

$$u(x,t) = \frac{1}{2\sqrt{\pi D_0 t}} \int_0^\infty \phi(\xi) \left\{ e^{-\frac{(x+\xi)^2}{4D_0 t}} + e^{-\frac{(x-\xi)^2}{4D_0 t}} - \frac{v}{D_0}\xi - \frac{2h-v}{D_0} e^{\frac{h-v}{D_0}\xi} \int_{-\infty}^\xi e^{-\frac{(x+\eta)^2}{4D_0 t} + \frac{h}{D_0}\eta} d\eta \right\} d\xi \tag{4}$$

Diffusivity is closely concerned to growth temperature, impurity density and lattice defects. Growth rate V is concerned to growth temperature, density of silicon source gas, position of the substrate within the reaction chamber.

In case of external doping from gas phase, probability that impurity atoms once incorporated in the epitaxial layer fly out again, is small. Therefore, at the growing surface, evaporation flow can be neglected compared with segregation flow. That is, the relation: (diffusion flow)+(segregation flow)=0, holds at the growing surface. Diffusion flow at the growing surface is proportional to the difference of impurity density between inner surface 1 and outer surface 2. Impurity density at the outer surface 2 is expressed by the product of impurity density in gas phase and segregation constant. Therefore, the detailed description of the boundary condition at the growing surface is as follows. That is, D'x (impurity density at the inner surface 1)—segregation constant x (impurity density of the gas phase)= —k x (impurity density of the gas phase). Here D' and k are proportional constant of diffusion flow and segregation flow near the growing surface. After all, the boundary condition of doping from gas phase is that impurity density of inner surface 1=(segregation constant $-k/D'$) x (impurity density in the gas phase). Therefore it is clear that impurity density at inner surface 1 can be controlled by changing the impurity density in the gas phase. Impurity density at inner surface is a function of growth time when the impurity density in the gas phase and/or its conductivity type are varied with time. Basic equation and initial condition are same as Eqs. (1) and (2), respectively.

Boundary condition is, neglecting the evaporation $$u(x,t) = f(t), \text{ at } x = vt. \tag{5}$$

Function f(t) is a surface impurity content doped from gas phase as diffusion source at the growing surface. When diffusivity is time invariant: $D(t) = D_0$, following analytical solution can be as follows;

$$u(x,t) = \frac{1}{2\sqrt{\pi D_0 t}} \int_0^\infty \phi(\xi) \left( e^{-\frac{(x-\xi)^2}{4D_0 t}} - e^{-\frac{(x+\xi)^2}{4D_0 t}} - \frac{v}{D_0}\xi \right) d\xi + \frac{-x+vt}{2\sqrt{\pi D_0}} \int_0^t f(\tau) \frac{e^{-\frac{(x-v\tau)^2}{4D_0(t-\tau)}}}{(t-\tau)^{3/2}} d\tau. \tag{6}$$

When substrate is completely pure; $\psi(x) = 0$, impurity distribution is described by $$u(x,t) = \frac{-x + vt}{2\sqrt{\pi D_0}} \int_0^t f(\tau) \frac{e^{-\frac{(x-v\tau)^2}{4D_0(t-\tau)}}}{(t-\tau)^{3/2}} d\tau. \tag{7}$$

Impurity profile actually realized is the sum of Equations (4) and (6) or (7). It is necessary to select the shape of $\psi(x)$ of Eq. (4) to realize the desired impurity profile.

It is effective for the realization of any desired impurity profile to control the doping level from gas phase as a function of time. Assuming (i) time invariant diffusivity $D_0$, (ii) perfect intrinsic substrate, Eq. (7) is a fundamental equation. When boundary condition f(t) is given, impurity profile u(x,t) is determined by Eq. (7). Alternatively, f(t) can be determined, if u(x,t) is given.

Desired impurity profile at $t = T$ is denoted as $u^*(x)$ and f(t) is named as boundary control function. Following equations are derived by putting relationship $u^*(x) = u(x, T)$ into Eq. (7);

$$\int_0^T K(x,\tau) f(\tau) d\tau = u^*(x), \tag{8}$$

where $$K(x,\tau) = \frac{-x + vT}{2\sqrt{\pi D_0}} \frac{e^{-\frac{(x-v\tau)^2}{4D_0(T-\tau)}}}{(T-\tau)^{3/2}} \tag{9}$$

Figure 2:
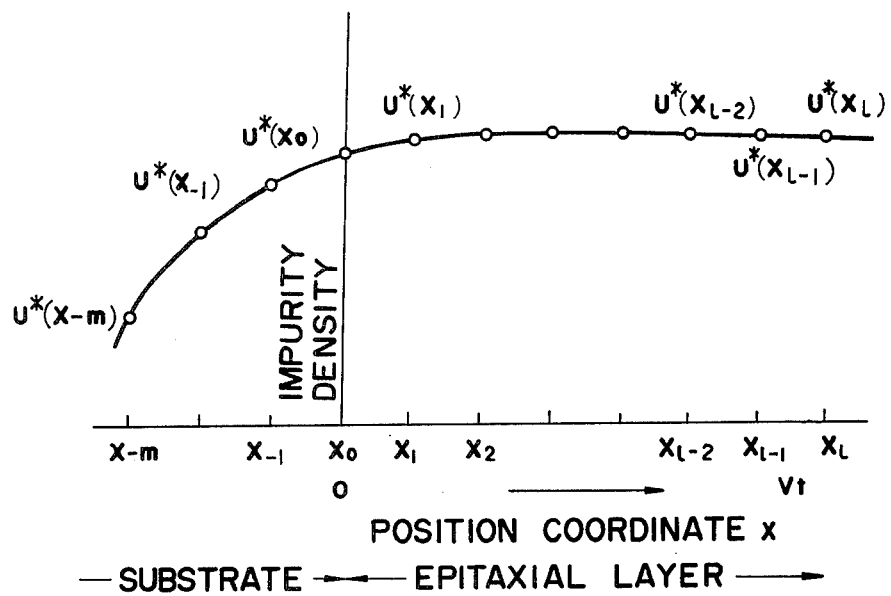
FIG. 2 is a graph showing sampling points in the substrate and in the epitaxial layer for explaining the principle of the present invention.

This is a Fredholm type first kind integral equation with asymetric kernel. Difficulty to derive analytical solution of Eq. (8) seems to be concerned with the fact that the diffusion phenomena is irreversible. Therefore, this boundary value problem is treated using finite difference method from a technological standpoint. Position coordinate x and time coordinate t are quantized into a number of finite elements. FIG. 2 shows the sampling of desired impurity profile $u^*(x)$ at $m+l+1$ points between $x = x_{-m}$ and $x = x_0 = Vt$. Boundary control function f(t) is limited to such a function as superposition of step function: $f(t) = f_i$ constant during $t_{i-1} \leq t < t_i$, $i = 1 \sim n$ by dividing the interval between $t = t_0 = 0$ and $t = t_n = T$ into n section. Equation (8) is transformed into the finite element matrix equation;

$$\begin{bmatrix} k_{11} & k_{12} & \cdots & k_{1n} \\ k_{21} & k_{22} & \cdots & k_{2n} \\ \vdots & \vdots & & \vdots \\ k_{m+l,1} & k_{m+l,2} & \cdots & k_{m+l,n} \end{bmatrix} \begin{bmatrix} f_0 \\ f_1 \\ \vdots \\ f_{n-1} \end{bmatrix} = \begin{bmatrix} u_1 \\ u_2 \\ \vdots \\ u_{m+l} \end{bmatrix} \tag{10}$$

where $$k_{ij} = \int_{t_{j-1}}^{t_j} K(x_{-m+i}, \tau) d\tau \tag{11}$$

and $$u_i = u^*(x_{-m+i}) \tag{12}$$

If a number of space division $m+l$ equals time division n, Eq. (10) is n dimensional simultaneous equation where unknowns are $f_0 \sim f_{n-1}$. Equation (10) is the basic equation about the realization of the desired impurity profile. Procedure of solving Eq. (10) is as follows.

(i) Sampling of desired impurity profile is carried out at $m+l$ points (m points within substrate and l points within epitaxial layer). Thus row vector $U = [u_1, u_2, \ldots, u_{m+l}]'$ is made. Distances of sampling points are not always uniform. Sign of $u_1 \sim u_{m+l}$ may be plus or minus.

(ii) Growth time is divided into n intervals, n is equal to the number of sampling points $m+l$. Time intervals are not always uniform.

(iii) n×n matrix $$K = \begin{bmatrix} k_{n11} & \cdots & k_{1n} \\ \vdots & & \vdots \\ k_{m+l,1} & \cdots & k_{m+l,n} \end{bmatrix}$$

of Eq. (10) is made by using eigen function in impurity doping, that is, Eq. (9) and Eq. (11).

(iv) Row vector $f = [f_0, f_1, \ldots, f_{n-1}]'$ is solved by performing matrix operation to the Eq. (10). Step-like function which varies abruptly $f_0, f_1, \ldots f_{n-1}$ in sequence from the origin of time coordinate is the boundary control function. The sign of $f_0 \sim f_{n-1}$ may be plus or minus.

Finite difference method is similar to AD conversion in the field of measurements and control. So it is necessary to sample finely when profile varies abruptly. When impurity profile varies gently, distance between sampling points may be large. Position coordinate within the epitaxial layer is given by the product of growth rate and the growth time at which the growing surface reaches the position. When position coordinate is divided finely, it is better to divide closely the time coordinate. That is, finite difference of growth time preferably correspond to the interval of sampling points.

Figure 3:
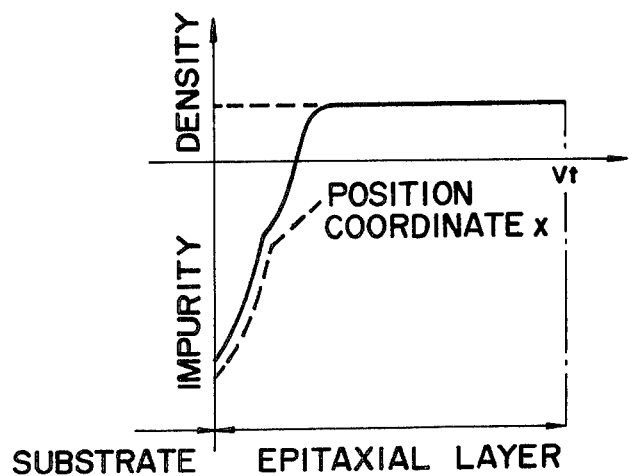
FIG. 3 is a graph showing a doping profile for realizing a stepwise impurity distribution.

Doping method to realize the desired impurity profile is automatically determined by using the doping program described before. Input profile to the doping program is the sum of the desired impurity profile and such distribution which compensate the solid state diffusion from the substance and autodoping. If step-wise profile is needed in FIG. 1, input profile as FIG. 3 should be considered. Dotted line in FIG. 3 is the acceptor distribution which compensate the solid state diffusion and autodoping from the substrate. Solid line is the sum of the dotted line and the constant donor level, which can realize a step function profile. If the impurity distribution shown by the solid line is realized by the external doping from gas phase, deformation of the impurity profile near the interface between substrate and epitaxial layer is canceled at the end of epitaxial growth and the crystal with abrupt step profile is realized.

Figure 4A:
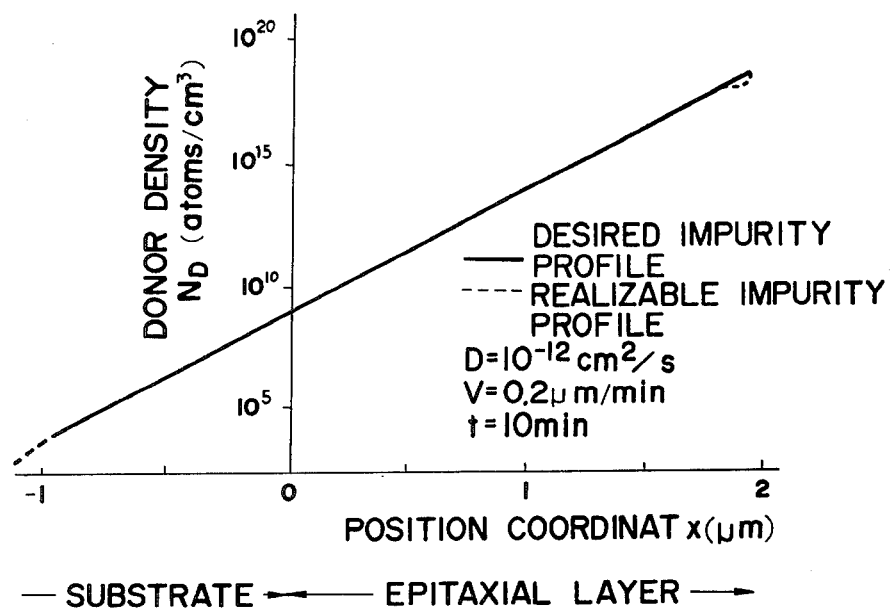
FIGS. 4A and 4B are graphs showing an exponential impurity distribution and a doping program for realizing the same, respectively.
Figure 4B:
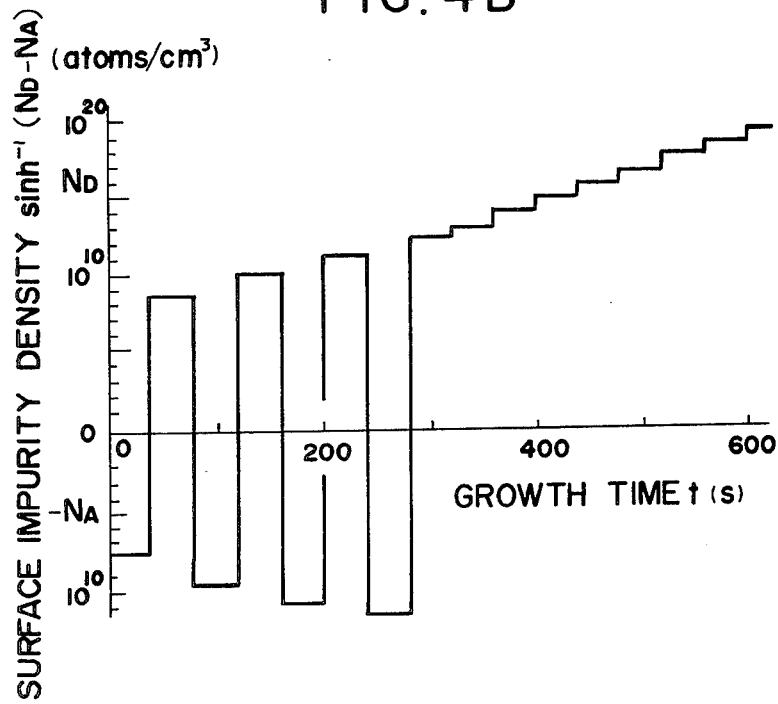

FIG. 4 is the example where the control algorithm of the invention is applied to the exponential impurity profile. Desired profile of FIG. 4A drawn by solid line is $u^*(x) = 10^{-5x+9}$ atoms/cm$^3$ (x is expressed in micrometer) in the region $-1 \mu m < x < 2 \mu m$ at time T = 10 min. Growth temperature and growth rate are constant in usual epitaxial growth. Diffusion constant of impurity may be considered to be constant. Therefore, diffusion constant and growth rate are assumed to be $10^{-12}$ cm$^2$/s and 0.2 $\mu$m/min constant respectively before computing the boundary control function. Growth time is assumed to be 10 min., so the thickness of epitaxial layer is 2 $\mu$m. These are typical values in actual growth condition. Sampling conditions are m=5, l=10 and distance of neighbouring sampling point $\Delta x$ is 0.2 $\mu$m constant. Setting every time division $\Delta t = t_i - t_{i-1} = T/n = 40$ sec. constant, boundary control function has been solved by using Eq. (10). FIG. 4B is the boundary control function computed by using Eq. (10). It is to be noted that conductivity type is inverted at every sampling point near the interface. Shape of the boundary control function become more gentle if the number of sampling points is increased. Involved in this regard are the following two factors. First, round off error of the computer is effective for the small order of $u^*(x)$ when the variation of the order of $u^*(x)$ is larger than ten. Secondly, it is anxious whether impurity profile among the sampling points as shown in FIG. 2 are controlled well. Therefore, difference $u^* - u$ has been estimated by calculating impurity profile u by substituting computed f obtained from Eq. (10) into Eq. (7). The cause of discrepancy between solid line and dotted line near the growing surface in FIG. 4B is that the impurity density at the surface $u^*(x_{-m})$ is not involved in Eq. (10). At the growing surface, relationship $u^*(x_{-m}) = f(t) = f_n$ has been applied for the sake of convenience. Dotted line is newly calculated profile at every 0.05 $\mu$m by using Eq. (7). Desired profile almost agree with the realized profile. Solid state diffusion and autodoping are not considered in FIG. 4, because this is the case when epitaxial layer exponential impurity profile is grown on high resistivity substrate.

It will be seen that a number of inversion in the conductivity type of impurity particularly near the substrate-epitaxial layer interface is effective to realize a desired doping profile. The number of inversion depends on the accuracy but is at least two and preferably more than two.

Figure 5A:
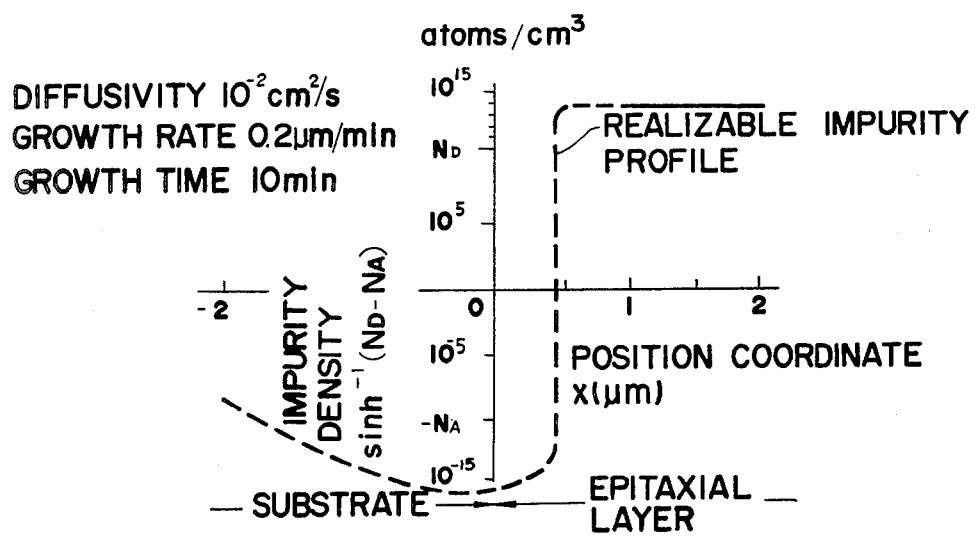
FIGS. 5A and 5B are graphs showing a stepwise impurity distribution and a doping program for realizing the same, respectively.
Figure 5B:
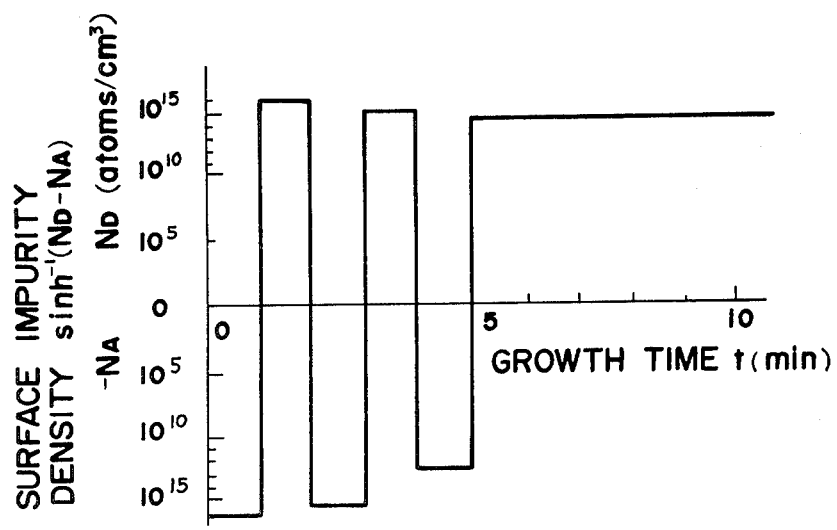

FIG. 5 is the example of converting the region near the n type substrate to high resistivity region by external doping from gas phase and forming nin junction which can be applied to the source-channel-drain structure of vertical FET or SIT (static induction transistor). If doping from the gas phase as shown in FIG. 5B is carried out to the n type substrate whose donor density is about 10·cm$^{-3}$, acceptor distribution formed in the substrate near the interface compensate the original donor distribution and convert the region to the high resistivity. Quantity of the acceptor incorporated in the inner region of the substrate is little, so its influence on the original donor distribution is small. Source-channel-drain structure of a vertical SIT can be formed by selecting proper values of impurity density and dimension of nin junction. Desired profile of FIG. 5B drawn by solid line is $u^*(x) = 10^{14}$ atoms/cm$^3$, in the region 1 $\mu m < x < 2 \mu m$ at time T = 10 min. Growth rate, growth time and diffusion constant of impurity are the same as FIG. 4. sampling points $\Delta x$ is 0.1 $\mu$m constant. Setting every time division $\Delta t = t_i - t_{i-1} = T/n = 60$ sec. constant, boundary control function has been calculated from Eq. (10). Number of sampling points is less compared with FIG. 4 though the growth time is same. Therefore the shape of boundary control function is rather simple as shown in FIG. 5B. Dotted line is realizable impurity profile computed at every 0.05 $\mu$m by substituting the boundary control function into Eq. (7).

It is found possible to suppress the bad influence of solid state diffusion and autodoping and to realize the epitaxial crystal with the desired impurity profile by changing the conductivity type of the impurity doped during epitaxial growth at least and preferably more than two times (diffusing both conductivity types of impurity) and compensating within the epitaxial crystal. Especially it is found effective for the impurity control to repeat alternate doping at the initial stage of growth.

Figure 6:
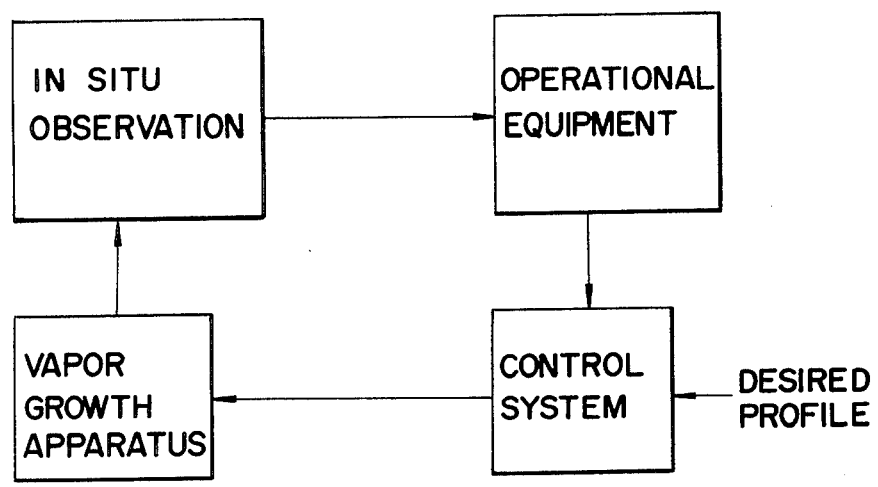
FIG. 6 is a block diagram of a vapor growth system with feed-back control.

Control algorithm described above can be also applied to the compensation of external disturbance during epitaxial growth. FIG. 6 is the block diagram for the explanation of detecting the external disturbance caused during epitaxial growth by the in-situ observation and compensating the effect of disturbance by repeating alternate doping of donor and acceptor. The part of operational equipment is a computer system provided with doping program. Even if an external disturbance happens during epitaxial growth, it is possible to perform instantaneous feed-back to cancel the effect of the disturbance by introducing such a monitoring and controlling system.

Summarizing the above, a doping program for realizing a desired doping profile can be computed by sampling an appropriate number of points in the crystal and an appropriate number (preferably the same number) of points in growth time and solving the equations of relation between the doping profile during growth and the final doping profile obtained at the end of growth. Epitaxial growth is carried out after the computed doping program while monitoring the doping characteristics during growth. Monitored deviation from the doping program is fed back to the control system for the epitaxial growth, preferably through program-correcting computation.

For achieving the above-described vapor growth, in-situ monitoring of the doped growth is recommended. Quickly responsive control of growth and doping is also recommended. Monitoring of the doped growth can be made in various ways. In-situ and direct monitoring is preferred for faithfully monitoring the actual growth. Optical measurement is found to be an effective monitoring technique. Particularly, infrared absorption is a method of directly knowing the content of a gas without need for transforming the constituents of the gas into other forms, such as ionizing, igniting or adsorbing molecules and/or atoms. Monitoring through infrared absorption will be mainly described hereinbelow.

Rapid control of growth and/or doping may be achieved by quickly changing the content of the reaction gas at least around the substrate on which an epitaxial layer is to be grown. Capillary system for locally feeding gas of predetermined content in the reaction chamber is effective for rapid control of gas content around the substrate. It will be apparent that carrier gas may be locally fed or dopant gas may be locally fed or both. Capillary system may also be used to sample reaction gas at any desired position for the purpose of monitoring the content of the gas.

Computation of a doping program and/or modification (correction) of the doping program may be achieved in a computer system, which will be apparent to those skilled in the art.

Hereinbelow, description will be mainly made on vapor growth with monitoring embodying the above-described principles.

Figure 7:
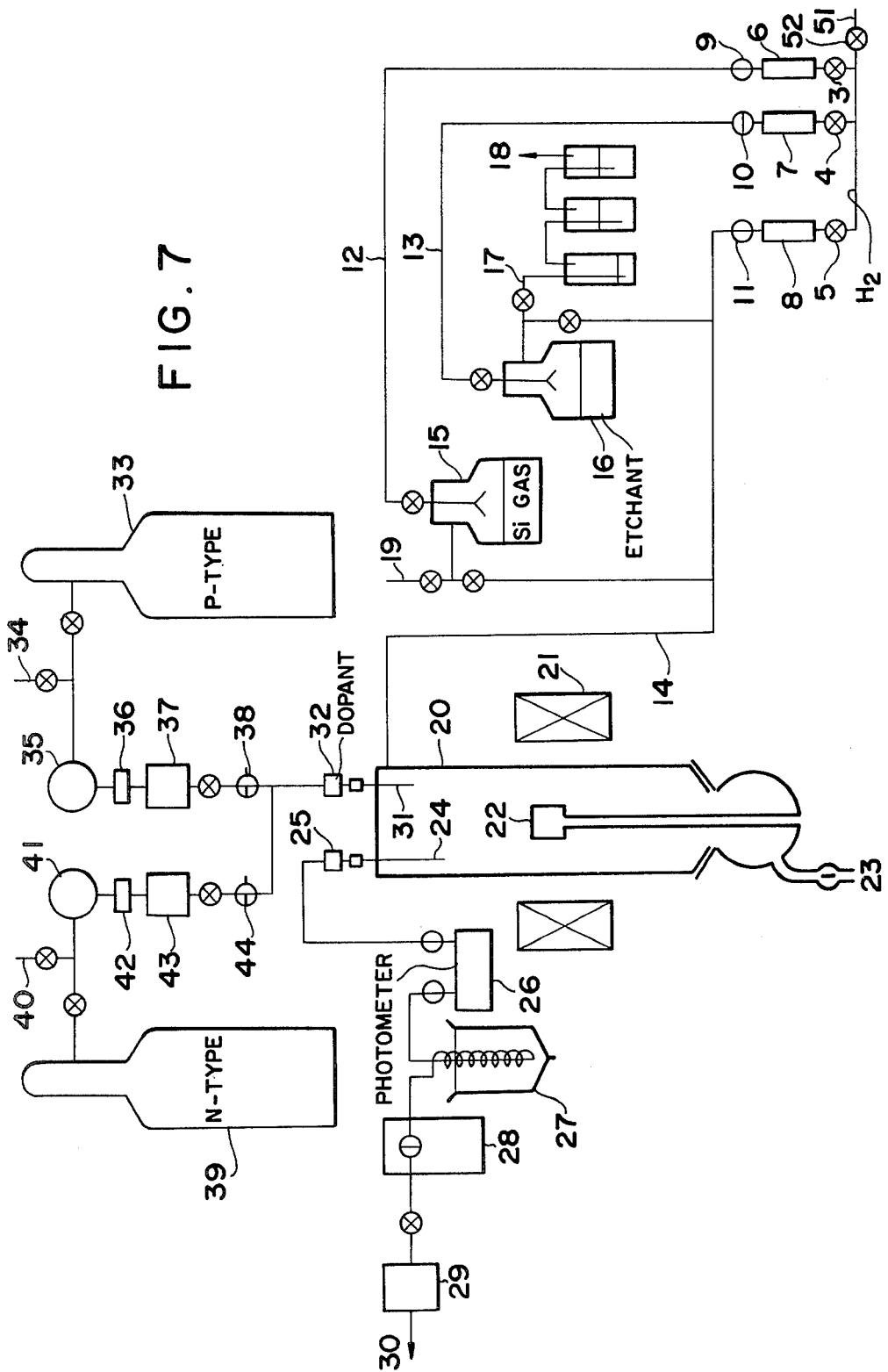
FIG. 7 is a schematic diagram showing an example of the growth apparatus provided with in-situ monitoring system to be used in the system of FIG. 6.

FIG. 7 shows a CVD (chemical vapor deposition) apparatus provided with in-situ observation of the doped growth. Carrier gas $H_2$ through a flow path 51 is introduced to the apparatus of epitaxial growth via stop valve 52. Needle valves 3, 4, 5 are used for the control of flow rate of $H_2$ through respective flow paths provided with flow meters 6, 7, 8 Numerals 9, 10, 11 denote two-way cocks. Flow path 12 enters a vessel 15 which contains $SiCl_4$. Evaporation of $SiCl_4$ is controlled by the flow rate of $H_2$ gas, similarly, flow path 13 enters the vessel 16 which contains $Br_2$ and evaporation of $Br_2$ used for the etching of the Si substrate is controlled. HCl may also be used as the etching gas. Numerals 17, 18, 19 denote pipe passes for purging gas. Silicon source gas and etching gas are introduced to the main flow pass 14 where carrier gas is flowing. The mixed gas enters a reaction chamber 20. Numeral 21 denotes a heating furnace. The reaction chamber is heated to about 1100° C.~1200° C. Numeral 22 denotes a susceptor or boat for loading Si substrate. Numeral 23 denotes a purge pipe of the exhaust gas. Flow path via quartz capillary 24 is connected to the gas cell 26 of the infrared spectrophotometer. Reacting gas is sampled at the tip of the capillary 24 which is movable via a sliding connector 25. A vacuum pump 29 can evacuate the gas cell 26 and serve to introduce sampling gas into the cell 26. The flow rate is measured by a nanometer 28. Numeral 30 is the purge pipe and 27 is the trap of harmful gas involved in the purging gas. The flow path via connector 32 and quartz capillary 31 is for supplying the pulse of dopant gas to the Si substrate. The pipes 34 and 40 which are provided on the way of this flow path are used for diluting the dopant gas and for purging the dopant of first conductivity type remaining in the capillary 31 when dopant is changed from the first conductivity type to the second conductivity type. At the same time of the exchange, the remaining gas within the reaction chamber is swept away by flowing etching gas in the main pass 14. Thus, the components of the reacting gas changes abruptly. Gas cylinder 33 is filled with P type dopant gas and balance gas at an appropriate mixing ratio. Similarly, gas cylinder 39 is filled with n type dopant gas and balance gas. Numerals 35 and 41 represent pressure control regulators, 37 and 43 are equipment for mass flow control, 36 and 42 are gas line filter which are used for avoiding dusts from entering and stopping the mass flow controller 37 and 43 and 38 and 44 are purge pipes.

Various net impurity profile can be realized in epitaxial technique, since impurity can be doped arbitrarily during growth. The impurity profile realized by using only one kind of dopant is restricted to some shapes, even if the quantity of dopant is changed during growth. But various impurity profiles can be realized by repeating the doping compensation in the equipment of FIG. 7. It is effective for the realization of pulse-like gas needed in the doping compensation to supply the dopant in front of the Si substrate via capillary shown in FIG. 7. Another method of supplying pulse-like dopant is to set the container of the dopant with stop valve at the root of the capillary. Dopant gas is instantaneously supplyed into the reaction chamber when the stop valve is opened. The growth apparatus of FIG. 7 may be provided with a feed back loop from the monitoring equipment to the control system of gas flow for correcting the doping program upon any external disturbance during growth.

Figure 8:
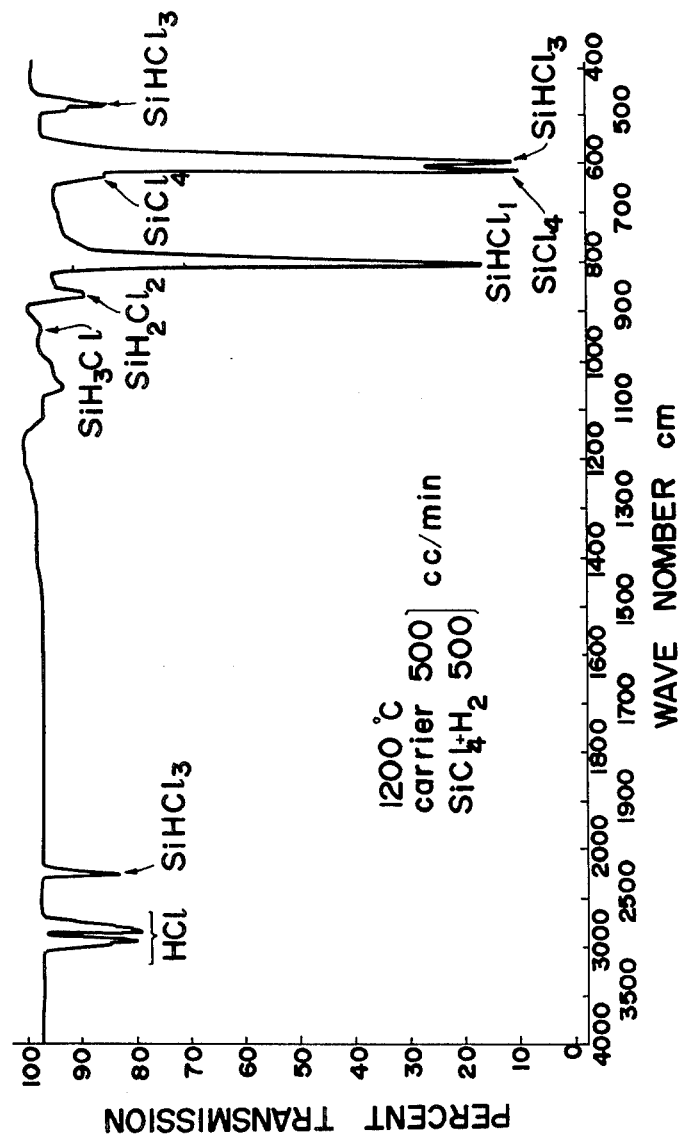
FIGS. 8 and 9 are transmission spectra of a gas including $BBr_3$ as a dopant sampled from a reaction chamber.

FIG. 8 is the absorption spectrum obtained by the in situ monitoring of the $H_2$ reduction of $SiCl_4$ by using the infrared spectrophotometer. This data means that $SiCl_4$ changes to $SiHCl_3$, $SiH_2Cl_2$ and so on by reacting with carrier $H_2$. In the spectrum, HCl which etches the Si surface appears simultaneously. Various gas species used in the semiconductor process can be detected quantitatively by the infrared absorption.

Simple and cheap monitoring system adapted for experiment and manufacture can be provided by the adoption of an infrared spectrophotometer of the wavelength scanning type. But detection limit of the infrared spectrophotometer may become a subject of discussion when desired impurity density of the epitaxial layer is very small. If the length of the gas cell is increased or multireflection in the gas cell is used, absorption becomes large and detection limit will be improved. When observation frequency is determined, scanning infrared spectrophotometer is not always necessary. In this case, it is easy to improve the detection limit.

Figure 9:
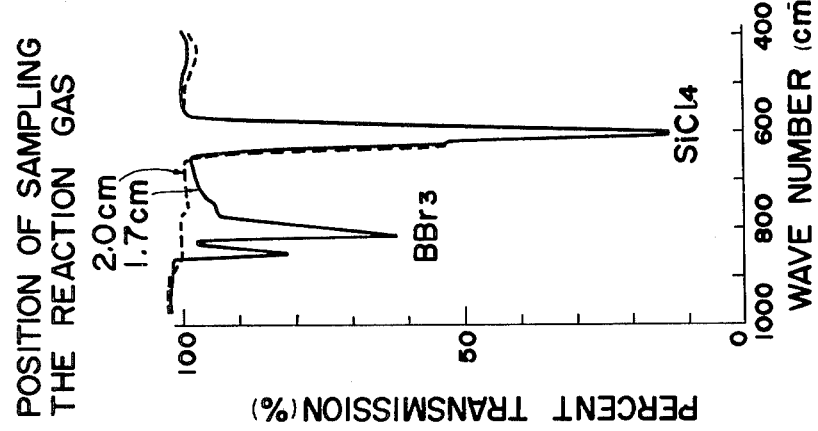

Typical infrared absorption spectra of $BBr_3$ doping gas in the reduction of $SiCl_4$ is shown in FIG. 9 indicating $BBr_3$ absorption peaks.

Figure 10:
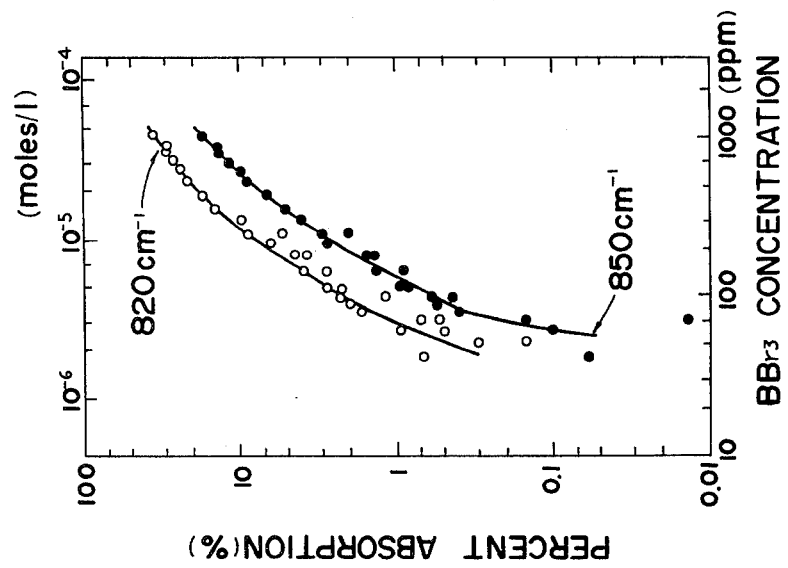
FIG. 10 is a graph showing the relation between absorption and $BBr_3$ concentration in the source gas.

FIG. 10 shows the relationship between absorption percent and content of gaseous $BBr_3$. Once such relation as that of FIG. 10 is obtained, the concentration of the gaseous dopant can be determined from the observed absorption. Wave number of the characteristic absorption of various gas species used in the semiconductor process are listed in table I.

TABLE I

| Species | Wave Number of the Absorption (am$^{-1}$) | Percent Transmission (Concentration of the Species is 10 ppm) |
|---|---|---|
| $BBr_3$ | around 827,850 | Refer to FIG. 10 |
| $B_2H_6$ | 1603 | 97.7 |
| $PCl_3$ | 510,507 | |
| $PH_3$ | 2323 | 99.1 |
| $AsH_3$ | 2095 | |
| $SbH_3$ | 1894 | 89.1 |
| $SiCl_4$ | 620 ± 1 | |
| $SiHCl_3$ | 2274, 810, 600, 497 | |
| $SiH_2Cl_2$ | 2200, 953, 877, 710, 610, 592, 531 | |
| $SiH_4$ | 2187, 2183, 978, 910 | |

Intensity of the absorption depends on the pressure of the gas and the length of the gas cell. That is, Lambert-Beer's law holds as follows.

$$I = I_0 10^{-\alpha cd} \qquad (13)$$

Here, $I_0$ is the intensity of the incident light, I is the intensity of the transmitted light, C is the concentration of the specimen [g/l], d is the length of the gas cell [cm], $\alpha$ is the absorption coefficient. But it is recommended to measure the calibration curve as shown in FIG. 10 for the purpose of accurately obtaining the concentration of the gas quantitatively from the absorption or transmission.

Figure 11:
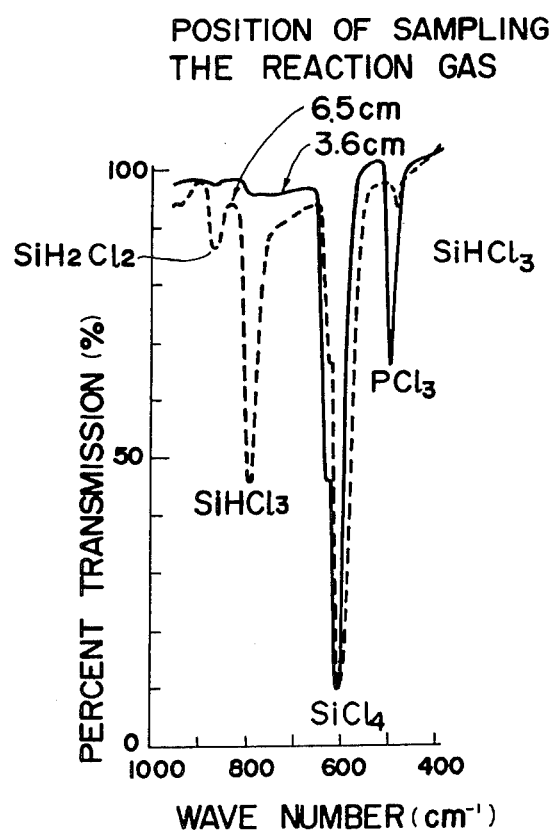
FIG. 11 is a transmission spectrum of a gas including $PCl_3$ as a dopant sampled from a reaction chamber.

FIG. 11 is the typical infrared absorption spectrum of $PCl_3$ doping gas in the $H_2$ reduction of $SiCl_4$. It will be apparent that similar monitoring and control can be done in this $PCl_3$-doped vapor growth. Monitoring the infrared absorption has been explained hitherto in the case of scanning of the wavelength. For the purpose of accurately monitoring the time variation of the content of particular specimen, continuous observation (time scanning) of a particular absorption peak or peaks is preferred. In such cases, wave number may be fixed and time scanning may be carried out.

Figure 12:
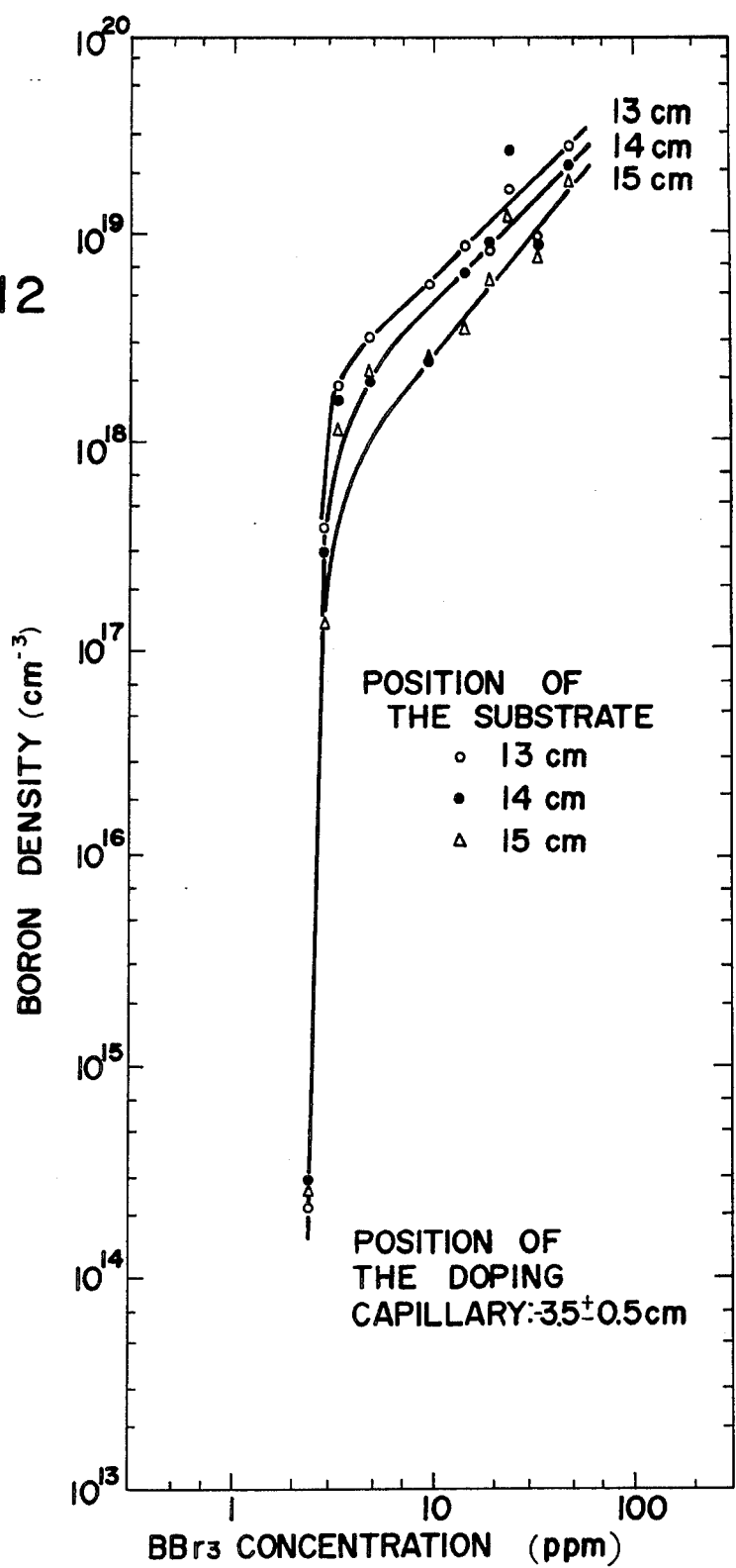
FIG. 12 is a graph showing an observed relation between the boron concentration in a grown epitaxial layer and the $BBr_3$ concentration in the reaction gas.

FIG. 12 is an observed relation between the concentration of $BBr_3$ in the reacting gas and the boron density in the grown epitaxial layer. The tip of the capillary for supplying $BBr_3$ is positioned at about 3.5 cm measured from the edge of the heating furnace. Positions of the Si substrates were 13, 14 and 15 cm from the edge of the heating furnace.

Figure 13A:
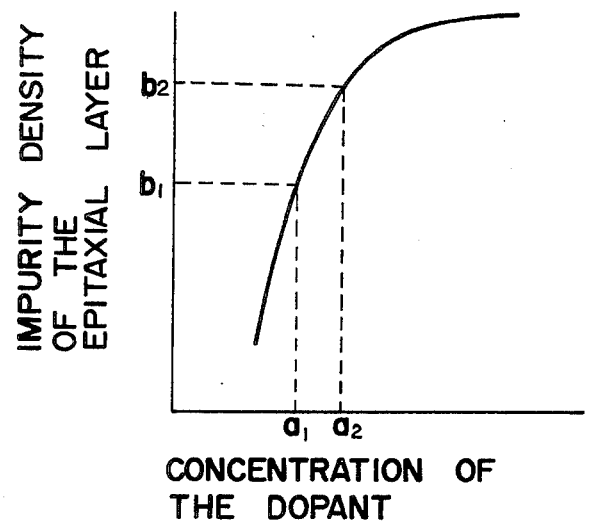
Figure 13B:
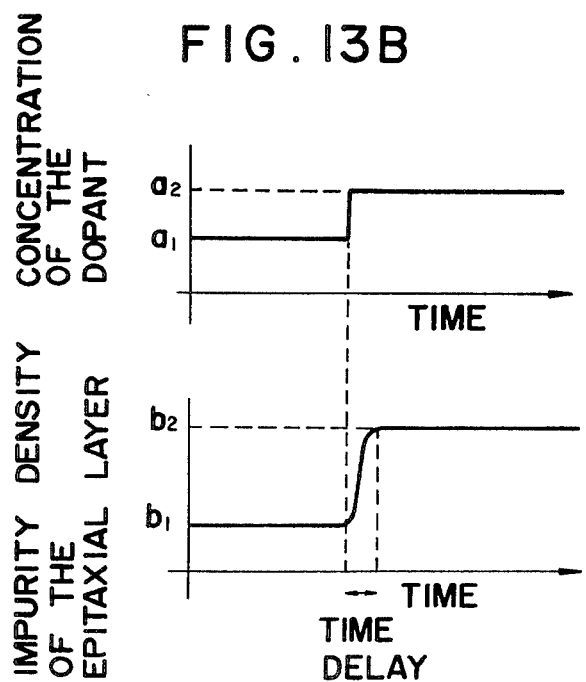

FIGS. 13A and 13B explain the time variant control of the doping for realizing a special impurity profile within an epitaxial layer. If the concentration of the impurity in the reaction gas is changed from $a_1$ to $a_2$ in FIG. 13A, impurity density in the epitaxial layer changes from $b_1$ to $b_2$ as shown in FIG. 13B, though there is some time delay. It is effective to sweep away the remaining gas in the reaction tube by flowing etching gas, for example, $Br_2$, in such cases as when dopant gas is exchanged alternately.

Figure 14:
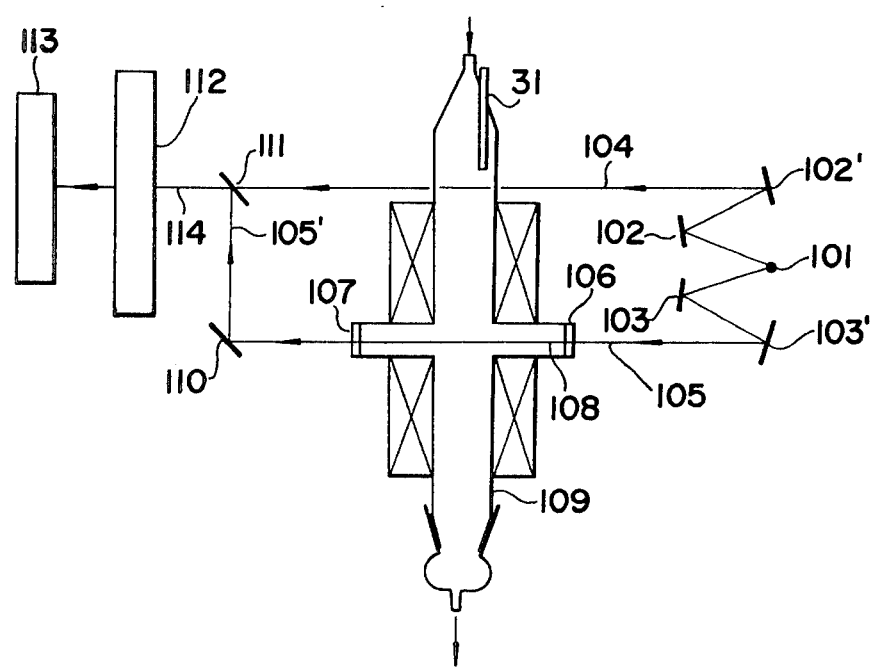
FIG. 14 is a schematic diagram showing part of another example of growth apparatus provided with an in-situ monitoring system.

Another method for observing the components of reaction gas by infrared alsortion is shown in FIG. 14. Light emitted from 101 is splitted to two beams 104 and 105 by the reflectors 102, 102' and 103, 103'. Beam 105 enters the reaction chamber 109 through KBr window 106. The path of light beam 108 may be formed of optical fiber which can eliminate the need for focusing the beam. Light beam is bended toward the beam collector 111 by the bender 110 after it is subjected to absorption in the reaction tube and passes through another KBr window 107. Beam 104 does not enter the reaction tube 109. At the beam collector 111, two beams 104 and 105' are directed to follow a same light path 114. The beam in the path 114 is dispersed at the monochrometer 112 and enters the detector 113.

Compared with the sample-and monitor system shown in FIG. 7 in which the gas in the reaction tube is sampled and introduced into an external gas cell and monitored, the system shown in FIG. 14 enables direct monitoring in which a sample light is injected into the reaction chamber and subjected to infrared absorption. There is no possibility that reaction gas is cooled and converted into another species. Since the intensity of light injected for the measurements of absorption is not so high as to influence the specimen, there is no possibility of advancing chemical reaction which may alter the growth mechanism. There is a time delay for the observed doping gas until it is adsorbed at the growing surface due to various reasons. It is better to observe the gas at a position nearest to the growing surface and just before it is adsorbed to the growing surface for reducing the above-mentioned delay and raise the monitoring accuracy.

In the usual vapor growth, it would be very difficult to successively grow a high resistivity layer shortly after the growth of a very low resistivity layer, even when the supply of dopant is cut off and only the source and carrier gases are supplied into the reaction chamber. This is probably ascribed to the residual dopant which may be adsorbed on the wall of the reaction chamber etc. Such a problem is small in the growth of high resistivity layer. Thus, the present invention is more effective, at the present stage of CVD technique, for the growth of a high resistivity layer.

In the semiconductor devices, it is often the case that a high resistivity epitaxial layer is formed on a low resistivity substrate for the purpose of providing a high breakdown voltage, low noise, etc. In such cases, the present invention is particularly useful in suppressing the affects of solid diffusion and autodoping and providing a desired doping profile, e.g. abrupt junction formed of p and n type layers of uniform resistivity (net impurity concentration).

It will be apparent that the present invention can be applied in various ways and that alterations and modifications of the described embodiments are naturally within the scope of this invention. For example, any combinations of the conductivity type for the substrate and the epitaxial layer can be adopted. Dopant is not restricted to shallow donors and acceptors but also may be deep level impurities such as Au, Ni, etc. Semiconductor material is not limited to Si but may be Ge, GaAs, or other compound semiconductors.

What is claimed is:

1. Method of controlled doped vapor growth of a doped crystalline semiconductor layer having a desired impurity density distribution profile on and within a semiconductor substrate, comprising the steps of:
    (a) defining said desired impurity density distribution profile on and within the semiconductor substrate as a function of a position coordinate located at an arbitrary position in the grown doped crystalline semiconductor layer to be produced and corresponding to a distance measured from the boundary between said substrate and said grown layer,
    (b) calculating, by computer means, the desired instantaneous doping level on the surface of the growing layer, corresponding to said grown layer, to be controlled at an arbitrary time during the doped vapor growth process as measured from the start of the doped vapor growth,
    (c) performing the doped vapor growth process in a reaction chamber by passing a doped vapor growth providing vapor stream through said chamber according to the calculated desired instantaneous doping levels while controlling the gaseous composition of the vapor stream passing through said chamber so as to make the corresponding actual instantaneous doping levels produced during the growth process equal to the corresponding calculated desired instantaneous doping levels,
    (d) monitoring the actual instantaneous doping levels from the start of the vapor growth progressively during the growth process by determining the gaseous composition of the vapor stream passing through said chamber, (e) calculating, by computer means, during the growth process the corresponding actual impurity density distribution profile at the total growth time based upon each monitored said actual instantaneous doping level, (f) calculating by computer means, during the growth process a deviation of the calculated desired instantaneous doping level corresponding to each monitored said actual instantaneous doping level, according to said step (b), and (g) revising said calculating desired instantaneous doping level to be controlled during the remainder of the growth process according to each such deviation.

2. Method according to claim 1, wherein said substrate is of one conductivity type, and the growth process includes growing a first thin layer doped with impurity atoms of the corresponding conductivity type opposite to that of said substrate, and subsequently growing a second thin layer doped with impurity atoms of the same conductivity type as that of said substrate.

3. Method according to claim 1 wherein said monitoring in said step (d) is performed by observing the gaseous composition of the vapor stream in an observing means which includes a part of said chamber as a component part thereof.

4. Method according to claim 3 wherein said observing means is operated for passing infrared rays into the vapor stream in said chamber, for receiving said infrared rays which have propagated through said vapor stream, and for analyzing the spectrum of the so received infrared rays for determining the gaseous composition of said vapor stream.

5. Method according to claim 1 wherein said monitoring in said step (d) is performed by observing the gaseous composition of the vapor stream using a capillary positioned in said chamber for sampling said vapor stream for determining the gaseous composition thereof.

6. Method according to claim 1 wherein said position coordinate, said arbitrary time, said desired impurity density distribution profile and said desired instantaneous doping level to be controlled are respectively defined as sets of discrete samples thereof expressed in matrix form by computer means.

* * * * *